(12) United States Patent
Kang

(10) Patent No.: US 10,672,346 B2
(45) Date of Patent: Jun. 2, 2020

(54) DOUBLE SIDED DISPLAY

(71) Applicant: LG DISPLAY CO., LTD., Seoul (KR)

(72) Inventor: Minhyung Kang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/141,175

(22) Filed: Sep. 25, 2018

(65) Prior Publication Data

US 2019/0103060 A1  Apr. 4, 2019

(30) Foreign Application Priority Data

Sep. 29, 2017 (KR) .................. 10-2017-0128238

(51) Int. Cl.
*G09G 3/3291* (2016.01)
*G09G 3/3266* (2016.01)
(Continued)

(52) U.S. Cl.
CPC ......... *G09G 3/3291* (2013.01); *G09G 3/3233* (2013.01); *G09G 3/3266* (2013.01); *H01L 27/124* (2013.01); *H01L 27/3267* (2013.01); *H01L 27/3276* (2013.01); *H01L 51/5206* (2013.01); *G09G 2300/043* (2013.01); *G09G 2300/0408* (2013.01); *G09G 2300/0426* (2013.01); *G09G 2300/0443* (2013.01); *G09G 2300/0804* (2013.01); *G09G 2300/0842* (2013.01); *G09G 2300/0861* (2013.01); *G09G 2310/08* (2013.01); *G09G 2320/0295* (2013.01); *G09G 2320/045* (2013.01); *H01L 27/322* (2013.01); *H01L 51/5221* (2013.01); *H01L 2251/5323* (2013.01)

(58) Field of Classification Search
CPC .. G09G 3/3291; G09G 3/3233; G09G 3/3266; H01L 27/124; H01L 27/3267; H01L 27/3276; H01L 51/5206
See application file for complete search history.

(56) References Cited

U.S. PATENT DOCUMENTS 5,896,119 A   4/1999  Evanicky et al.
9,173,272 B2 * 10/2015  Lee ..................... H05B 47/10
(Continued)

FOREIGN PATENT DOCUMENTS

KR   100 747 683 B1    8/2007
KR   20080102630 A    11/2008
(Continued)

OTHER PUBLICATIONS

Search Report dated Jan. 30, 2019 issued in the corresponding European Patent Application No. 18195397.7, 10 Pages.

*Primary Examiner* — Sardis F Azongha
(74) *Attorney, Agent, or Firm* — Polsinelli PC

(57) ABSTRACT

A double-sided display comprises: a first data driver that is connected to one end of the data lines and applies a data signal of a first image to the data lines; and a second data driver that is connected to the other end of the data lines and applies a data signal of a second image to the data lines. The first data driver supplies a first pixel data signal of the first image to a first data line and an nth pixel data signal of the first image to an nth data line, and the second data driver supplies a first pixel data signal of the second image to the nth data line and an nth pixel data signal of the second image to the first data line.

20 Claims, 10 Drawing Sheets

(51) Int. Cl.
  *G09G 3/3233* (2016.01)
  *H01L 27/32* (2006.01)
  *H01L 27/12* (2006.01)
  *H01L 51/52* (2006.01)

(56) References Cited

U.S. PATENT DOCUMENTS

| | | | |
|---|---|---|---|
| 9,245,934 B2 * | 1/2016 | Chung | H01L 27/3267 |
| 9,252,196 B2 * | 2/2016 | Kim | H01L 27/3267 |
| 9,634,075 B2 * | 4/2017 | Chung | H01L 27/326 |
| 2005/0151830 A1 * | 7/2005 | Yamazaki | G09G 3/20 |
| | | | 347/238 |
| 2007/0045620 A1 | 3/2007 | Park et al. | |
| 2009/0045751 A1 | 2/2009 | Peng | |
| 2011/0148944 A1 * | 6/2011 | Kobayashi | G09G 3/3225 |
| | | | 345/690 |
| 2013/0334503 A1 * | 12/2013 | Seo | H01L 51/52 |
| | | | 257/40 |
| 2014/0131713 A1 * | 5/2014 | Lee | H01L 29/4908 |
| | | | 257/59 |
| 2015/0076456 A1 * | 3/2015 | Choi | H01L 27/3267 |
| | | | 257/40 |
| 2015/0188083 A1 * | 7/2015 | Jang | H01L 27/124 |
| | | | 257/40 |
| 2016/0071445 A1 * | 3/2016 | Kim | G09G 3/006 |
| | | | 345/212 |

FOREIGN PATENT DOCUMENTS

| | | | |
|---|---|---|---|
| KR | 20170049777 A | 5/2017 | |
| WO | 2017/098375 A1 | 6/2017 | |

* cited by examiner

DOUBLE SIDED DISPLAY

CROSS REFERENCE TO RELATED APPLICATION

This application claims the benefit of Korean Patent Application No. 10-2017-0128238 filed on Sep. 29, 2017, the entire contents of which is incorporated herein by reference in its entirety for all purposes as if fully set forth herein.

BACKGROUND

Field of the Disclosure

The present disclosure relates to a double-sided display that is capable of displaying an image on both front and back sides of a display panel.

Description of the Background

A double-sided display displays an image on both front and back sides of a display panel. In the double-sided display, a front pixel array and a back pixel array may be driven with a common drive circuit, in order to simplify the drive circuits of the pixel arrays on the front and the back. However, this method is problematic in that a left-right reversed image is output on either the front or back side of the display panel.

SUMMARY

The present disclosure provides a double-sided display that is capable of displaying an image without left-right reversed image on both the front and back of a display panel.

In one aspect, there is provided a double-sided display comprising a display panel where n data lines (n is a positive integer equal to or greater than 2) and m gate lines (m is a positive integer equal to or greater than 2) intersect each other and a plurality of subpixels are arranged; a first data driver that is connected to one end of the data lines and applies a data signal of a first image to the data lines; a second data driver that is connected to the other end of the data lines and applies a data signal of a second image to the data lines; and a gate driver that is connected to the gate lines and sequentially applies a gate signal to the gate lines. Each subpixel comprises a first light-emitting part that emits light toward the front of the display panel; and a second light-emitting part that emits light toward the back of the display panel, wherein the first data driver supplies a first pixel data signal of the first image to a first data line and an nth pixel data signal of the first image to an nth data line, and the second data driver supplies a first pixel data signal of the second image to the nth data line and an nth pixel data signal of the second image to the first data line.

The first light-emitting part and the second light-emitting part share a data line and a gate line.

Light emitted from the first light-emitting part is reflected off a first anode and passes through a first cathode, and light emitted from the second light-emitting part is reflected off a second cathode and passes through a second anode.

The first and second light-emitting parts are driven simultaneously or alternately at predetermined time intervals.

Each subpixel comprises: a first light-emitting diode that emits light from the first light-emitting part; a second light-emitting diode that emits light from the second light-emitting part; a driving element that drives the first and second light-emitting parts in response to a gate-source voltage; and a capacitor that stores the gate-source voltage of the driving element.

Each subpixel further comprises: a first switching element that turns on in response to a scan signal applied through a first gate line to connect a gate of the driving element to a data line; and a second switching element that turns on in response to a sensing signal applied through a second gate line to connect a sensing line to a source of the driving element.

Each subpixel further comprises: a third switching element that switches a current path between the driving element and the first light-emitting part in response to a first emission control signal; and a fourth switching element that switches a current path between the driving element and the second light-emitting part in response to a second emission control signal.

Each subpixel comprises: a first light-emitting diode that emits light from the first light-emitting part; a second light-emitting diode that emits light from the second light-emitting part; a driving element that drives the first and second light-emitting parts in response to a gate-source voltage; a capacitor that stores the gate-source voltage of the driving element; a first switching element that turns on in response to a scan signal applied through a gate line to connect a gate of the driving element to a data line; a third switching element that switches a current path between the driving element and the first light-emitting part in response to a first emission control signal; and a fourth switching element that switches a current path between the driving element and the second light-emitting part in response to a second emission control signal.

In another aspect, there is provided a double-sided display comprising a display panel where n data lines (n is a positive integer equal to or greater than 2) and m gate lines (m is a positive integer equal to or greater than 2) intersect each other and a plurality of subpixels are arranged; a data driver that is connected to one end of the data lines and applies a data signal of a first image or a data signal of a second image to the data lines; a gate driver that is connected to the gate lines and sequentially applies a gate signal to the gate lines. Each subpixel comprises a first light-emitting part that emits light toward the front of the display panel; and a second light-emitting part that emits light toward the back of the display panel, wherein the data driver supplies a data signal representing at least part of the first image to the n data lines during a first display period, and the data driver supplies a data signal representing at least part of the second image to the n data lines during a second display period.

BRIEF DESCRIPTION OF THE DRAWINGS

The accompanying drawings, which are included to provide a further understanding of the disclosure are incorporated in and constitute a part of this application, illustrate aspects of the disclosure and together with the description serve to explain the principles of the disclosure.

In the drawings.

DETAILED DESCRIPTION

Figure 1:
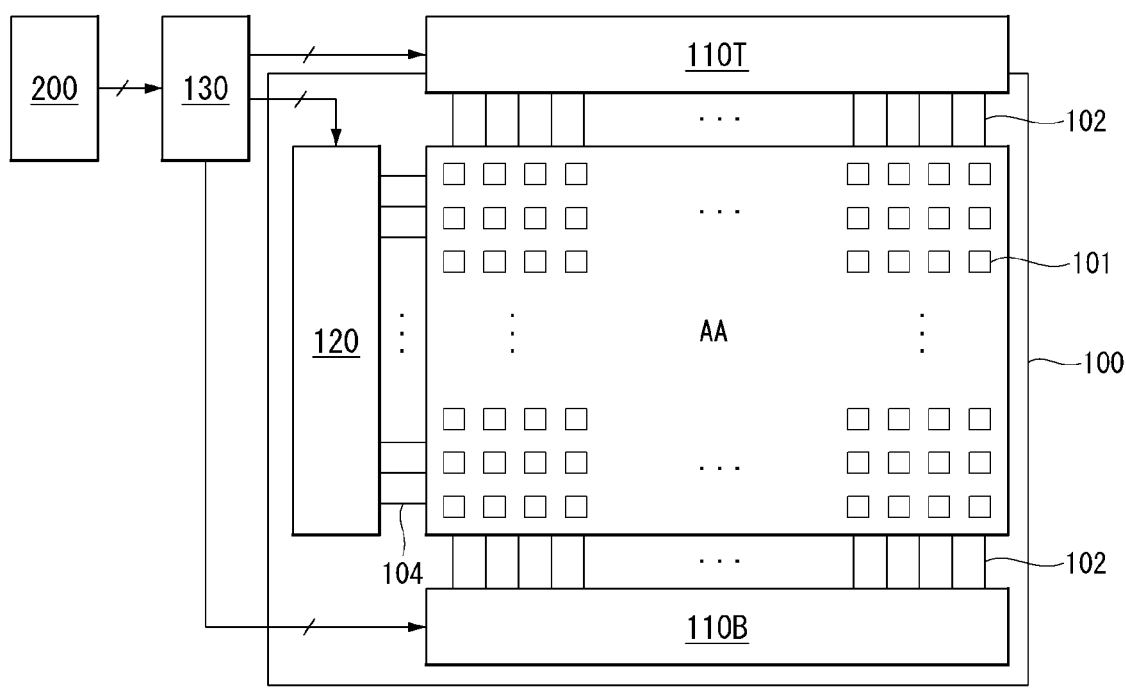
FIG. 1 is a block diagram showing a double-sided display according to an exemplary aspect of the present disclosure.

Various aspects and features of the present disclosure and methods of accomplishing them may be understood more readily by reference to the following detailed descriptions of exemplary aspects and the accompanying drawings. The present disclosure may, however, be embodied in many different forms and should not be construed as being limited to the exemplary aspects set forth herein. Rather, these exemplary aspects are provided so that this disclosure will be thorough and complete and will fully convey the concept of the present disclosure to those skilled in the art, and the present disclosure is defined by the appended claims.

The shapes, sizes, proportions, angles, numbers, etc. shown in the figures to describe the exemplary aspects of the present disclosure are merely examples and not limited to those shown in the figures. Like reference numerals denote like elements throughout the specification. In describing the present disclosure, detailed descriptions of related well-known technologies will be omitted to avoid unnecessary obscuring the present disclosure.

When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated.

When the position relation between two parts is described using the terms "on", "over", "under", "next to" and the like, one or more parts may be positioned between the two parts as long as the term "immediately" or "directly" is not used.

It will be understood that, although the terms "first", "second", etc. may be used herein to describe various elements, these elements are not limited by these terms.

The features of various exemplary aspects of the present disclosure may be coupled or combined with one another either partly or wholly, and may technically interact or work together in various ways. The exemplary aspects may be carried out independently or in connection with one another.

A double-sided display of this disclosure is implemented based on an electroluminescence display. The electroluminescence display may be categorized into an inorganic light-emitting display and an organic light-emitting display. An active matrix organic light-emitting display may comprise organic light-emitting diodes (hereinafter, "OLED") which are self-emitting elements.

A subpixel of an organic light-emitting display comprises a driving element that supplies current to the OLED in response to a gate-source voltage to drive the OLED. The driving element may be implemented by a transistor. The driving element drives the OLED by regulating the current flowing through the OLED in response to the gate-source voltage. The OLED of the organic light-emitting display comprises an anode, a cathode, and an organic compound layer situated between these electrodes. The organic compound layer consists of a hole injection layer (HIL), a hole transport layer (HTL), an emission layer (EML), an electron transport layer (ETL), and an electron injection layer (EIL). When a current flows through the OLED, a hole passing through the hole transport layer HTL and an electron passing through the electron transport layer ETL move to the emission layer EML, forming an exciton. As a result, the emission layer EML generates visible light.

The electrical characteristics of the pixels, such as the threshold voltage Vth of the driving element, the electron mobility μ of the driving element, and the threshold voltage of the OLED, should be the same for every pixel since they serve as a factor for determining the drive current Ids. However, the electrical characteristics may vary between pixels, due to various causes including process variation, temporal change, etc. This variation in the electrical characteristics of each pixel may lead to image quality degradation and reduced lifespan.

To compensate for variation in the electrical characteristics of the driving element, internal compensation and external compensation may be applied. In the internal compensation method, variation in the electrical characteristics of the driving element between pixels is automatically compensated for in real time by using the gate-source voltage of the driving element which varies with the electrical characteristics of the driving element. In the external compensation method, variation in the electrical characteristics of the driving element between pixels is compensated for by sensing the voltage of each pixel varying with the electrical characteristics of the driving element and modulating data of an input image by an external circuit based on the sensed voltage.

In a double-sided display of the present disclosure, a pixel circuit may comprise one or more of an n-type transistor (NMOS) and a p-type transistor (PMOS). The transistor may be implemented as an oxide transistor having an oxide semiconductor pattern or an LTPS transistor having a low-temperature polysilicon (LTPS) semiconductor pattern. The transistor is a three-electrode device with gate, source, and drain. The transistor may be implemented as a TFT (thin-film transistor) on the display panel 100. The source is an electrode that provides carriers to the transistor. The carriers in the transistor flow from the source. The drain is an electrode where the carriers leave the TFT. That is, the carriers in the transistor flow from the source to the drain. In the case of the n-type transistor (NMOS), the carriers are electrons, and thus the source voltage is lower than the drain voltage so that the electrons flow from the source to the drain. In the n-type transistor (NMOS), current flows from the drain to the source. In the case of the p-type transistor (PMOS), the carriers are holes, and thus the source voltage is higher than the drain voltage so that the holes flow from the source to the drain. In the p-type transistor (PMOS), since the holes flow from the source to the drain, current flows from the source to the drain. It should be noted that the source and drain of the transistor are not fixed in position since the source and drain are interchangeable depending on the applied voltage. In the following description, the source and drain of the transistor will be referred to as first and second electrodes.

A gate signal for TFTs used as switching elements swings between gate-on voltage and gate-off voltage. The gate-on voltage is set higher than the threshold voltage of the TFT, and the gate-off voltage is set lower than the threshold voltage of the TFT. The TFT turns on in response to the gate-on voltage and turns off in response to the gate-off voltage. In NMOS, the gate-on voltage may be gate-high voltage VGH, and the gate-off voltage may be gate-low voltage VGL. In PMOS, the gate-on voltage may be gate-low voltage VGL, and the gate-off voltage may be gate-high voltage VGH.

Hereinafter, various exemplary aspects of the present disclosure will be described in detail with reference to the accompanying drawings.

Figure 2:
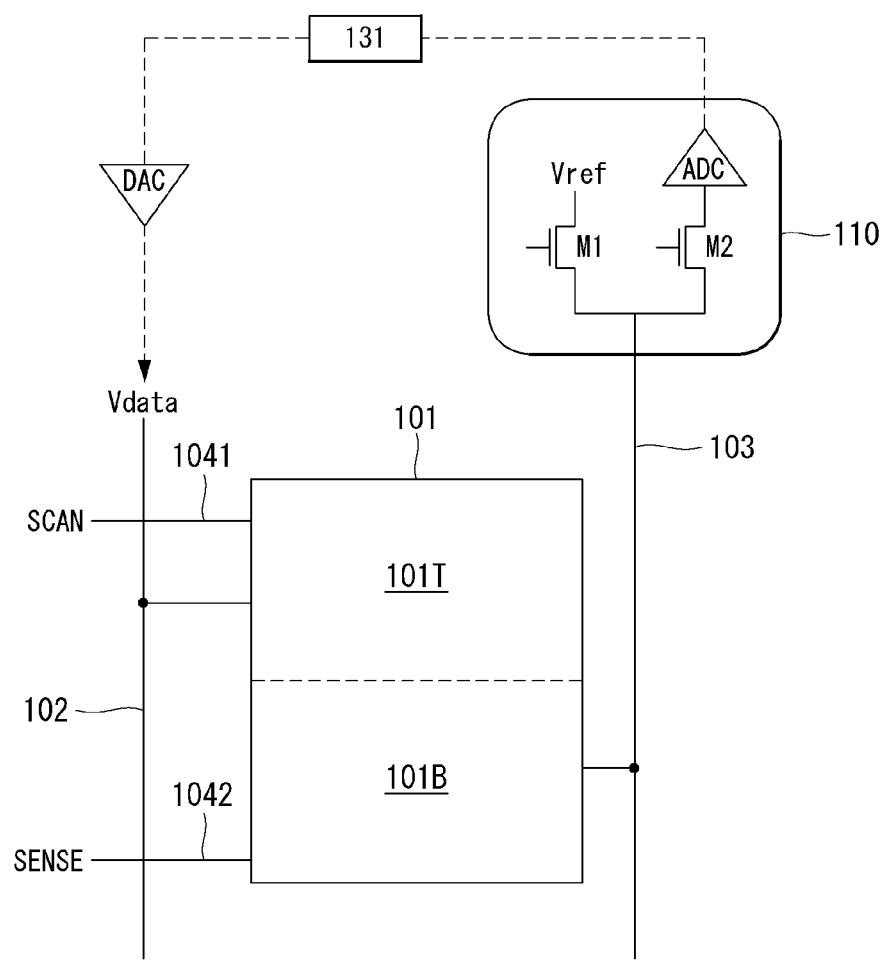
FIG. 2 is a circuit diagram showing a pixel circuit and a sensing path connected to the pixel circuit.

FIG. 1 is a block diagram showing a double-sided display according to an exemplary aspect of the present disclosure. FIG. 2 is a circuit diagram showing a pixel circuit and a sensing path connected to the pixel circuit.

Referring to FIGS. 1 and 2, the double-sided display according to the exemplary aspect comprises a display panel 100 and a display panel drive circuit.

The screen of the display panel 100 comprises an active area AA displaying an input image. A pixel array is arranged in the active area AA. The pixel array comprises a plurality of data lines 102, a plurality of gate lines 104 intersecting the data lines 102, and pixels arranged in a matrix.

Each pixel may be divided into a red subpixel, a green subpixel, and a blue subpixel for color representation. Each pixel may further comprise a white subpixel. Each subpixel 101 comprises a pixel circuit as shown in FIGS. 7 to 10.

Each subpixel 101 comprises a first light-emitting part 101T and a second light-emitting part 101B. The first light-emitting part 101T and the second light-emitting part 101B share a data line 102 and a gate line 104. The first light-emitting part 101T and the second light-emitting part 101B comprise their own light-emitting diodes. The first light-emitting part 101T comprises a top-emission region that emits light towards the front side of the display panel 100 to display a first image on the front of the display panel 100. The second light-emitting part 101B comprises a bottom-emission region that emits light towards the back side of the display panel 100 to display a second image on the back side of the display panel 100. To this end, the front and back of the display panel 100 are composed of a transparent substrate through which light can pass. Thus, the double-sided display of this disclosure may operate as a transparent display that displays an image on the front and back sides of the display panel 100 and enables the user to view the background or real objects beyond the display panel 100.

Touch sensors may be placed on the display panel 100. Touch input may be sensed using touch sensors or through the pixels. The touch sensors may be implemented as on-cell type- or add-on type touch sensors which are placed on the screen of the display panel, or as in-cell type touch sensors which are embedded in the pixel array.

The display panel drive circuit comprises data drivers 110T and 110B and a gate driver 120. A demultiplexer (not shown) may be placed between the data drivers 110T and 110B and the data lines 102.

The display panel drive circuit may further comprise a touch sensor driver for driving the touch sensors. The touch sensor driver is omitted in FIG. 1. In a mobile device or wearable device, the display panel drive circuit, a timing controller 130, and a power circuit may be integrated in a single integrated circuit.

The display panel drive circuit writes data of an input image to the pixels of the display panel 100 and displays the input image on the screen during a display driving period, under control of the timing controller (TCON) 130.

The display driving period may be divided into a double-sided display mode in which an image is displayed on both the front and back of the display panel 100 and a single-sided display mode in which an image is displayed on either the front or back. In the double-sided display mode, the first and second data drivers 110T and 110B drive the data lines 102 by alternately applying a data signal of an input image to the data lines 102 at predetermined intervals. In the double-sided display mode, the first and second light-emitting parts 101T and 101B of the pixel circuit shown in FIG. 8 may be simultaneously driven. In the double-sided display mode, the first and second light-emitting parts 101T and 101B of the pixel circuit shown in FIGS. 9 and 10 may be alternately driven at predetermined time intervals.

In the single-sided display mode, only one of the first and second data drivers 110T and 110B is enabled to supply a data signal to the data lines 102. The first data driver 110T is connected to one end of the data lines 102, and the second data driver 110B is connected to the other end of the data lines 102. Each data line is not separated between the first data driver 110T and the second data driver 110B but connected to the data drivers 110T and 110B. In the single-sided display mode, only one of the first and second light-emitting parts 101T and 101B is driven.

The first data driver 110T converts pixel data of a first image to be displayed on the first light-emitting parts 101T of the subpixels 101 into data signal Vdata and outputs it to the data lines 102. As shown in FIG. 2, the first data driver 110T converts pixel data (digital data) of a first image, received from the timing controller 130, into gamma-compensated voltage to generate a data signal Vdata by using a digital-to-analog converter (hereinafter, "DAC").

The second data driver 110B converts pixel data of a second image to be displayed on the second light-emitting parts 101B of the subpixels 101 into voltage of data signal Vdata and outputs it to the data lines 102. The second data driver 110B converts pixel data of a second image, received from the timing controller 130, into gamma-compensated voltage to generate a data signal Vdata by using the DAC. The second image may be the same as or different from the first image.

The demultiplexer distributes the data signals Vdata outputted from the first and second data drivers 110T and 110B to the data lines 102 by using a plurality of switching elements. A single channel of the first and second data drivers 110T and 110B is time-divided and connected to the data lines 102, thus reducing the number of data lines 102.

The gate driver 120 may be implemented as a GIP (Gate in Panel) circuit, formed directly in a bezel area on the display panel 100, along with a TFT array in the active area AA. The gate driver 120 outputs gate signals to the gate lines 104 under control of the timing controller 130. The gate driver 120 may sequentially supply the gate signals to the gate lines 104 by shifting these signals by a shift register. The gate signals may comprise, but not limited to, a scan signal SCAN and a sensing signal SENSE. The scan signal SCAN is applied to the subpixels 101 through a first gate line 1041, and the sensing signal SENSE is applied to the subpixels 101 through a second gate line 1042.

The scan signal SCAN controls the switching elements connected between the data lines 102 and the gates of the driving elements of the subpixels 101 to select pixels to which a data signal is applied. The sensing signal SENSE controls switching elements for connecting the subpixels 100 to sensing lines 103 shown in FIG. 2. The sensing signal SENSE selects pixels from which the electrical characteristics of the driving elements DT are sensed. Here, the electrical characteristics of the driving elements comprise at least one between mobility $\mu$ and threshold voltage Vth.

Figure 3A:
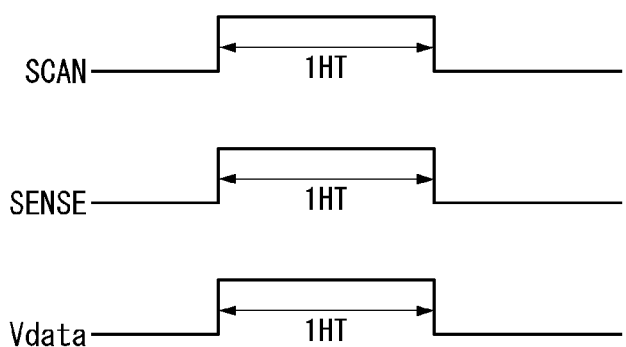
FIGS. 3A and 3B are waveform diagrams showing a scan signal, a sensing signal, and a data voltage.
Figure 3B:

The scan signal SCAN and the sensing signal SENSE are synchronized with the data signal Vdata, as shown in FIGS. 3A and 3B. During an active period AT, the pulses of the scan signal SCAN and sensing signal SENSE are generated as gate-on voltage during 1 horizontal period 1HT. The 1 horizontal period 1HT is the time required to write data to pixels arranged in one line on the display panel 100. During the 1 horizontal period 1HT, the data drivers 110T and 110B output a data signal Vdata corresponding to 1 line of data on the display panel 100 simultaneously to the data lines 102.

In a sensing mode in which the electrical characteristics of the subpixels are sensed through the sensing lines 103, the pulses of the scan signal SCAN and sensing signal SENSE are generated as gate-on voltage for a long period of time from several to several tens of msec.

One frame for the double-sided display is divided into an active period AT and a vertical blanking interval VB. The active period AT is the time when 1 frame of data is written to all the pixels on the screen. The vertical blanking interval VB is a given period of time between an (N−1)th active period and an Nth active period. During the vertical blanking interval VB, the next frame data (Nth frame data) is not received by the timing controller 130.

The sensing mode is divided into before product shipment and after product shipment. The threshold voltage of the driving element in each subpixel 101 is sensed through a sensing path connected to the pixels before product shipment, and then variation in the threshold voltage of every subpixels is compensated for based on the sensing result. Moreover, the mobility of the driving element in each subpixel may be sensed to thereby compensate for variation in mobility.

The sensing mode after product shipment is carried out in a power-on sequence ON, a vertical blanking interval VB, and a power-off sequence OFF. In the power-off sequence, after receiving a power-off signal, the display panel drive circuit and the sensing path are further driven for a preset delay time to sense the threshold voltage Vth of the driving element in each subpixel.

The timing controller 130 receives digital video data DATA of an input image and timing signals synchronized with the digital data from a host system (not shown). The timing signals comprise a vertical synchronization signal Vsync, a horizontal synchronization signal Hsync, a clock signal DCLK, and a data enable signal DE. The host system may be any one of the following: a TV (television) system, a set-top box, a navigation system, a personal computer PC, a home theater system, a mobile device, and a wearable device.

The timing controller 130 may adjust the frame rate to be higher than the input frame frequency. For example, the timing controller 130 may control the operation timing of the display panel drivers 110T, 110B, and 120 by multiplying the input frame frequency (Hz) by i times (i is a positive integer greater than 0). The frame frequency is 60 Hz in the NTSC (National Television Standards Committee) system and 50 Hz in the PAL (Phase-Alternating Line) system.

The timing controller 130 controls the operation timing of the display panel drive circuit by generating a data timing control signal for controlling the data drivers 110T and 110B and a gate timing control signal for controlling the gate driver 120 based on the timing signals Vsync, Hsync, and DE received from the host system. The gate timing control signal output from the timing controller 130 may be converted to gate-on voltage or gate-off voltage through a level shifter and supplied to the gate driver 120. The level shifter converts the low-level voltage of the gate timing control signal to gate-low voltage VGL and converts the high-level voltage of the gate timing control signal to gate-high voltage VGH.

Referring to FIG. 2, a sensing path may be connected to the subpixel. The sensing path may comprise a sensing line 103, an analog-to-digital converter (hereinafter, "ADC"), and switching elements M1 and M2. The sensing path may sense the electrical characteristics of the driving element by sensing a source voltage at the driving element. The switching element M1 resets the source voltage of the driving element to reference voltage Vref by supplying a predetermined reference voltage Vref to the sensing line 103. The switching element M2 is turned on after the turn-off of the switching element M1 and supplies the source voltage of the driving element to the ADC. The ADC converts analog sensing voltage to digital sensing data and sends it to a compensator 131. The threshold voltage or mobility of the driving element may be sensed through the sensing path by using a well-known sensing method. The ADC, along with the DAC, may be integrated in an IC (integrated circuit) of the data drivers 110T and 110B.

The compensator 131 stores compensation values for compensating the threshold voltage Vth and mobility μ of the driving element in each subpixel. The compensator 131 selects a preset compensation value based on digital sensing data received through the ADC, and adds this compensation value to pixel data (digital data) of an input image or multiplies them together to compensate the pixel data. The pixel data thus compensated is sent to the data drivers 110T and 110B and converted into voltage of data signal Vdata by the DAC of the data drivers 110T and 110B and supplied to the data line 102. The driving element of the pixel circuit is driven by the voltage of data signal Vdata supplied through the data line 102 to generate a current. A current flowing to the OLED, i.e., light-emitting element, through the driving element DT is determined by the gate-source voltage Vgs of the driving element DT. The compensator 131 may be implemented as an operational circuit within the timing controller 130.

Figure 4:
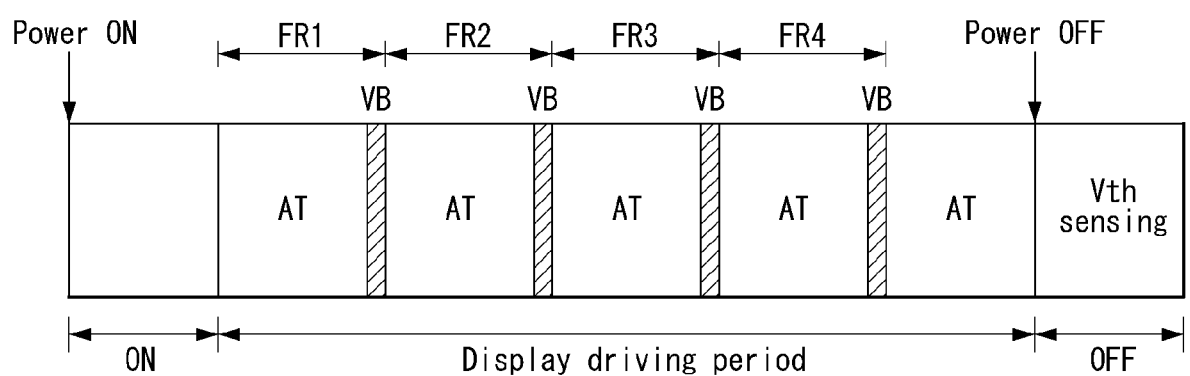
FIG. 4 is a view showing a power-on sequence, a display driving period, and a power-off sequence.
Figure 5A:
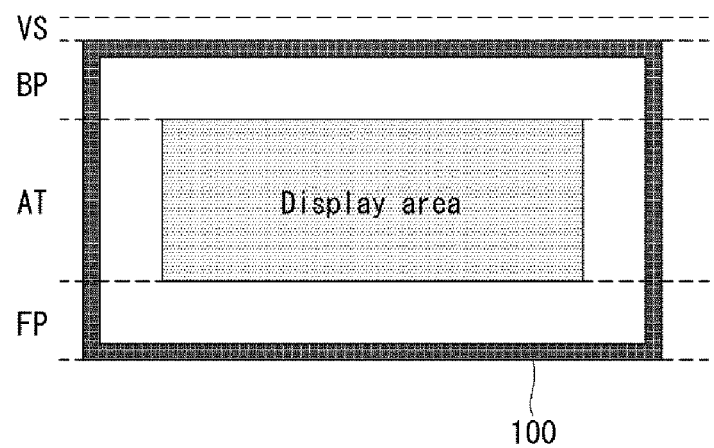
FIGS. 5A and 5B are a view showing in detail an active period and a vertical blanking interval, respectively.
Figure 5B:
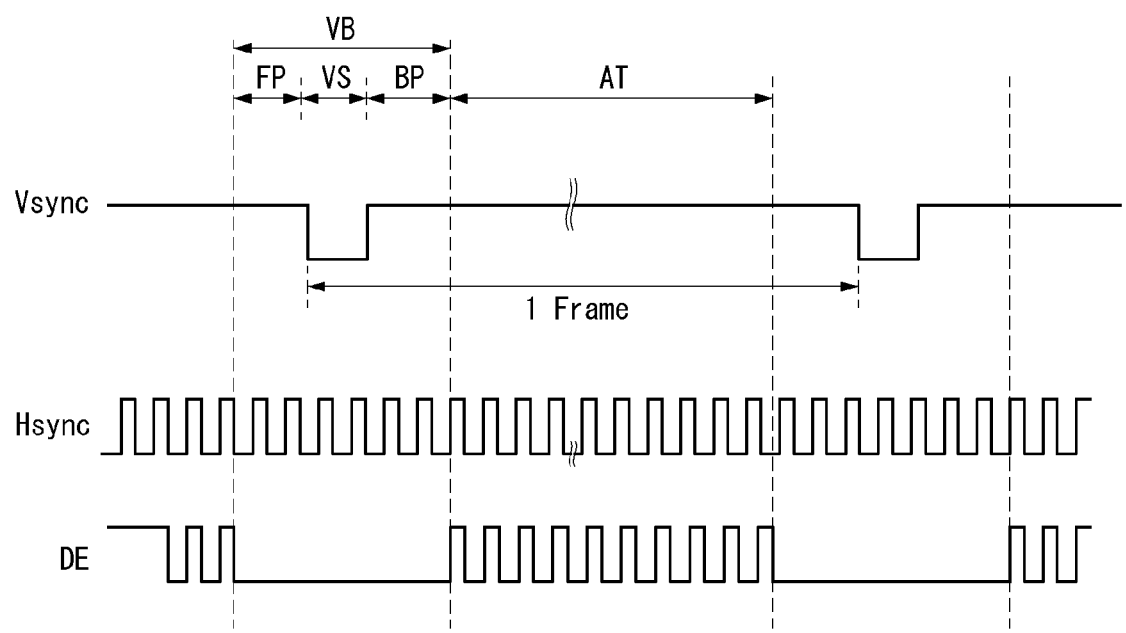

FIG. 4 is a view showing a power-on sequence, a display driving period, and a power-off sequence. FIGS. 5A and 5B are a view showing in detail an active period AT and a vertical blanking interval VB, respectively.

Referring to FIGS. 4, 5A and 5B, the power-on sequence ON starts after the display is powered on. In the power-on sequence ON, a driving voltage for the display panel drive circuit and display panel 100 is generated, and the display panel drive circuit is reset. In the power-on sequence ON and the vertical blanking interval VB of the display driving period, the mobility of the driving element DT is sensed, and variation in the mobility of the driving element DT is compensated for by a mobility compensation value selected based on the sensing result. The mobility compensation value may be updated based on this sensing result of the mobility of the driving element DT. During the display driving period, pixel data written to the pixels is updated for every frame, and an image is displayed on the screen.

The power-off sequence OFF starts after a display power-off signal is received. In the power-off sequence OFF, the threshold voltage Vth of each subpixel is sensed during a delay time in which the display panel drive circuit and the sensing path are further driven. The threshold voltage compensation value may be updated based on the sensing result of the threshold voltage which is sensed in real time during the power-off sequence.

A vertical synchronization signal Vsync defines 1 frame. A horizontal synchronization signal Hsync defines 1 horizontal time. A data enable signal DE defines the duration of valid data including pixel data to be displayed on the screen.

The data enable signal DE is synchronized with valid data to be displayed in the pixel array of the display panel 100. 1 pulse interval of the data enable signal DE is 1 horizontal time, and the high logic part of the data enable signal DE represents the time during which pixel data for 1 pixel line is inputted. 1 horizontal time 1H is the time required to write data to 1 pixel line of pixels on the display panel 100.

The timing controller 130 receives the data enable signal DE and data of an input image during the active period AT. The data enable signal DE and the input image data are not provided during the vertical blanking interval VB. During the active period AT, 1 frame of data to be written to all the pixels is received by the timing controller 130. 1 frame is the sum of the active period AT and the vertical blanking interval VB.

As can be seen from the data enable signal DE, no input data is received by the display device during the vertical blanking interval VB. The vertical blanking interval VB comprises a vertical sync time VS, a vertical front porch FP, and a vertical back porch BP.

In the case of the double-sided display according to the exemplary aspect of the present disclosure, in the double-sided display mode, the first and second data drivers 110T and 110B may operate alternately to time-divide a data signal for first and second images and supply it to the data lines 102. For example, the first data driver 110T may supply a data signal representing at least part of the first mage to the data lines 102 during a first display period and then supply a data signal representing at least part of the second image to the data lines 102 during a second display period.

In the case of a double-sided display according to another exemplary aspect of the present disclosure, in the double-sided display mode, one of the first and second data drivers 110T and 110B may time-divide a data signal for first and second images and supply it to the data lines 102. For example, the first data driver 110T may supply a data signal representing at least part of the first image to the data lines 102 during a first display period and then supply a data signal representing at least part of the second image to the data lines 102 during a second display period.

The first display period may be a period during which the first image is displayed through the first light-emitting parts 101T of the subpixels. The second display period may be a period during which the second image is displayed through the second light-emitting parts 101B of the subpixels. The first display period and the second display period may be alternately allocated so that the first and second light-emitting parts 101T and 101B are driven in a time-division manner. The first and second display periods may be properly set in consideration of flicker, ghost image, etc. For example, the first and second display periods each may be equal to 1 frame period, a period shorter than 1 frame, or N horizontal period(s) (N is a positive integer equal to or greater than 0). The period shorter than 1 frame may be a ½ frame period. The N horizontal period(s) may be 1 horizontal period.

In the case of the double-sided display according to the present disclosure, in the double-sided display mode, the first light-emitting part 101T and the second light-emitting part 101B may be driven in a time-division manner. The first light-emitting part 101T and the second light-emitting part 101B may be driven alternately at 1-frame intervals. In this case, if the double-sided display has a frame frequency of 120 Hz, the first light-emitting part 101T and the second light-emitting part 101B are driven at 60 Hz. The first light-emitting part 101T may be driven in odd-numbered frames FR1 and FR3 of FIG. 4 and display pixel data of a first image. The second light-emitting part 101B may be driven in even-numbered frames FR2 and FR4 of FIG. 4 and display pixel data of a second image. If the frame frequency is 120 Hz, 1 frame lasts for every 120th of a second.

In the double-sided display of the present disclosure, either the first light-emitting part 101T or the second light-emitting part 101B is driven on every frame, and the other is not driven. Light passes through the non-driven light-emitting part, and objects beyond the display panel may be seen through this light-emitting part.

Figure 6:
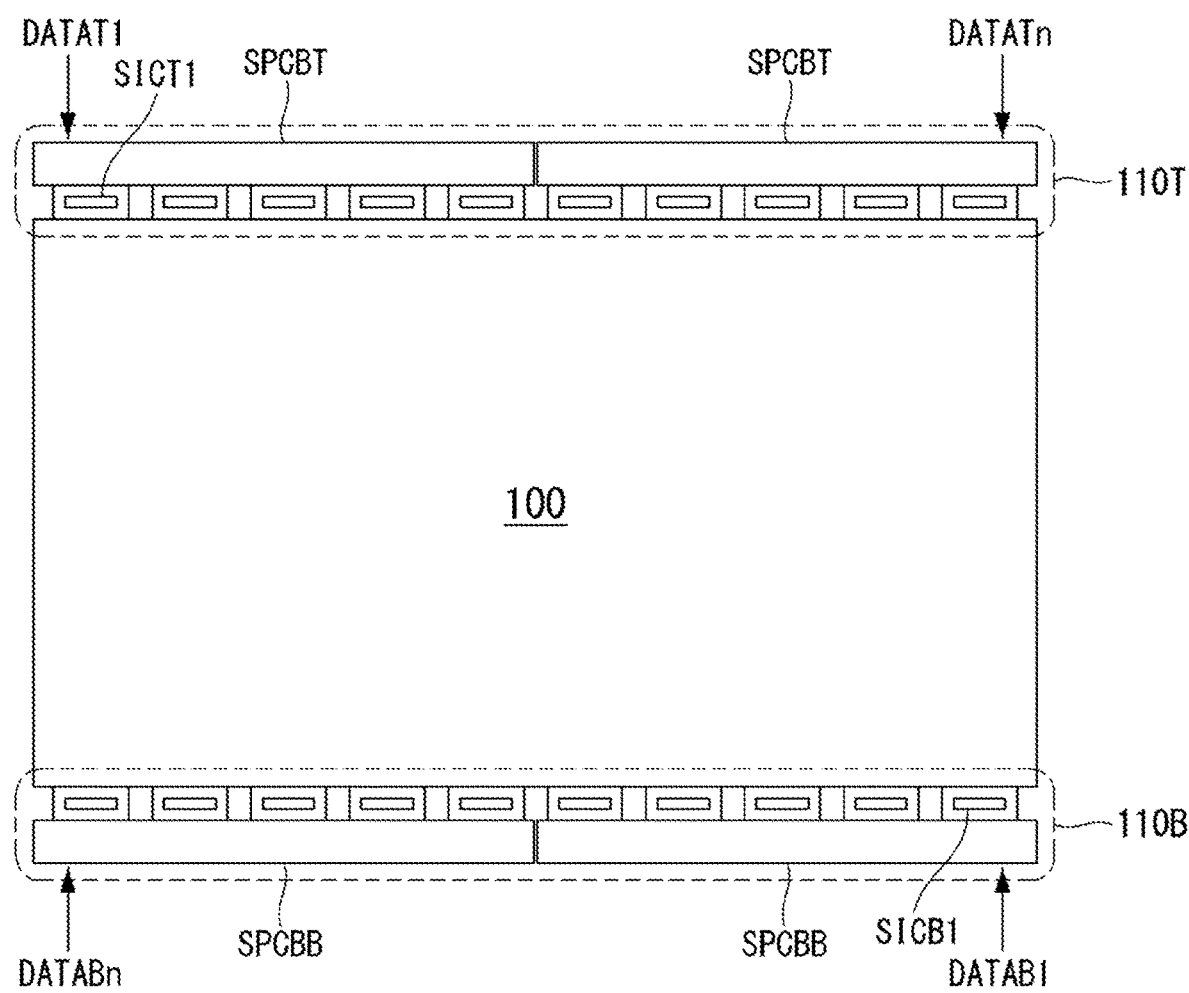
FIG. 6 is a plan view showing integrated circuits of data drivers connected to the display panel.

FIG. 6 is a plan view showing integrated circuits of the data drivers 110T and 110B connected to the display panel 100.

Referring to FIG. 6, the first data driver 110T may be placed on the top of the display panel 100 so as to be connected to one end of the data lines 102. The second data driver 110B may be placed on the bottom of the display panel 100 so as to be connected to the other end of the data lines 102.

The first data driver 110T comprises one or more source drive ICs (integrated circuit) SICT1 and a source PCB (source printed circuit board) SPCBT. The second data driver 110B comprises one or more source drive ICs (integrated circuit) SICB1 and a source PCB (source printed circuit board) SPCBB.

The source drive ICs SICT1 and SICB1 each may be mounted on a COF (chip on film). An input terminal of the COF is connected to output terminals of the source PCB SPCBT an SPCBB, and an output terminal of the COF is connected to data pads on the display panel 100. The COF may be bonded onto a substrate of the display panel 100 through an ACF (anisotropic conductive film). The source PCBs SPCBT and SPCBB comprise wires that connect the timing controller 130 and the source drive ICs SICT1 and SICB1.

The first data driver 110T supplies a first pixel data signal DATAT1 to a first data line at the leftmost side of the display panel 100 and an nth pixel data signal DATATn (n is a positive integer equal to or greater than 2), the last pixel data, to an nth data line at the rightmost side of the display panel 100.

The second data driver 110B supplies a first pixel data signal DATAB1 to the nth data line at the rightmost side of the display panel 100 and an nth pixel data signal DATABn, the last pixel data, to the first data line at the leftmost side of the display panel 100. The arrangement and sequence of data signals outputted from the first and second data drivers 110T and 110B are controlled by the timing controller 130. Thus, the sequences of pixel data of images to be displayed on the front and back of the display panel 100 may be controlled in opposite directions, and this allows the double-sided display of this disclosure to display images properly on both the front and back of the display panel 100 without left-right reversal.

In FIG. 6, "SICT1" refers to a first source drive IC of the first data driver 110T for supplying the first pixel data signal DATAT1 to the first data line. Due to the first source drive IC SICT1, first pixel data DATAT1 of a first image is written to the leftmost subpixel on the display panel 100 on every horizontal period. "SICB1" refers to a first source drive IC of the second data driver 110B for supplying the second pixel data signal DATAB1 to the nth data line. Due to the first source drive IC SICB1, first pixel data DATAB1 of a second image is written to the rightmost subpixel on the display panel 100 on every horizontal period. Thus, the positions of subpixels on the display panel 100 to which first pixel data is written are reversed on the first image displayed on the front of the display panel 100 and the second image displayed on the back of the display panel 100.

Figure 7:
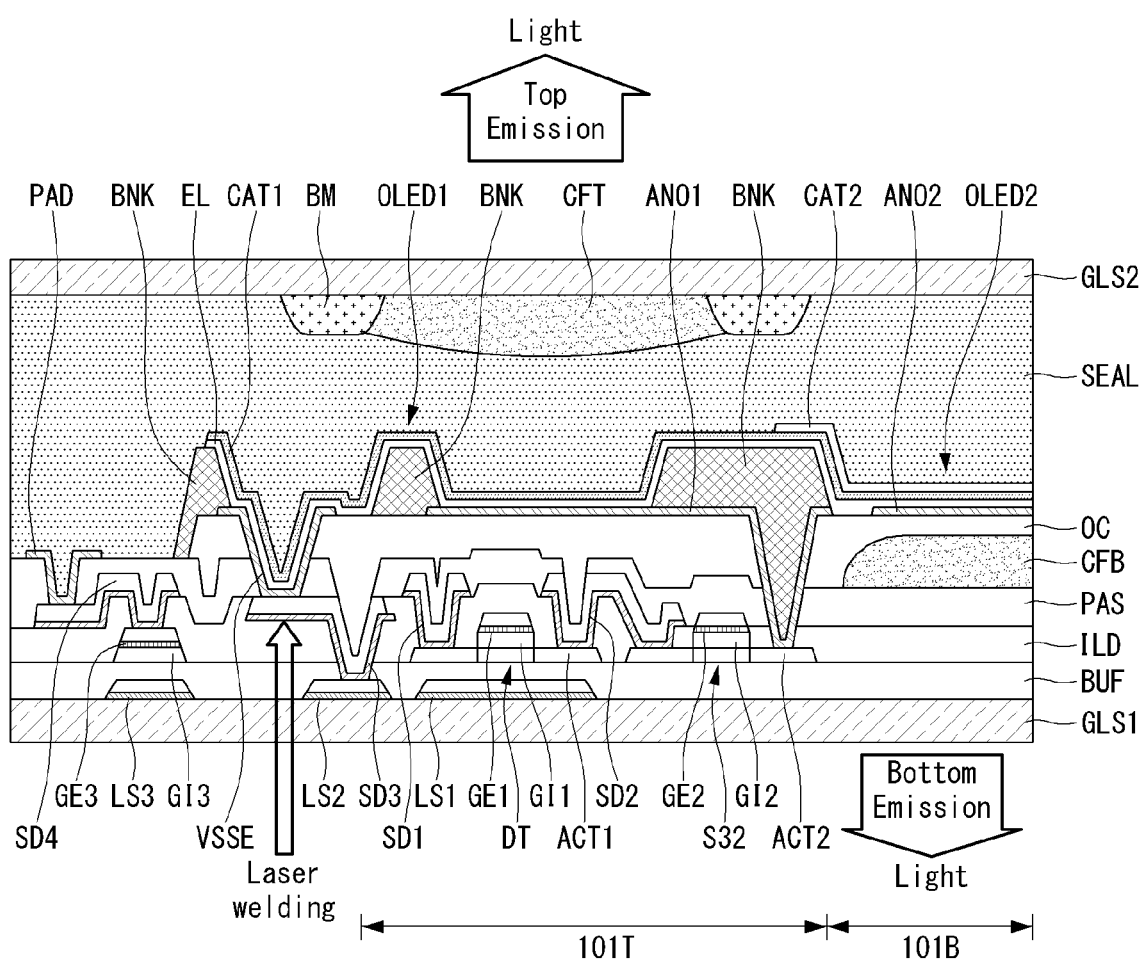
FIG. 7 is a cross-sectional view of a subpixel.

FIG. 7 is a cross-sectional view of a subpixel 101.

Referring to FIG. 7, each subpixel 101 is divided into a first light-emitting part 101T and a second light-emitting part 101B. The first light-emitting part 101T comprises a first light-emitting diode OLED1 of a top-emission structure that projects light towards the front of the display panel 100. The second light-emitting part 101B comprises a second light-emitting diode OLED2 of a bottom-emission structure that projects light towards the back of the display panel 100.

Each subpixel 101 comprises a driving element DT1, one or more switching elements, and a capacitor. In FIG. 7, some of the switching elements and the capacitor are omitted. The first light-emitting part 101T and the second light-emitting part 101B share a data line 102 and a gate lien 104 and share the driving element DT. Thus, the first light-emitting diode OLED1 and the second light-emitting diode OLED2 are driven by one driving element DT.

The first light-emitting part 101T and the second light-emitting part 101B comprise their own light-emitting diodes. The first light-emitting part 101T comprises a top-emission area that emits light towards the front of the display panel 100 to display a first image on the front of the display panel 100. The second light-emitting part 101B comprises a bottom-emission area that emits light towards the back of the display panel 100 to display a second image on the back of the display panel 100.

In the cross-sectional structure of the subpixel 101, a first metal pattern is formed on a first transparent substrate GLS1. The first metal pattern may be formed of a double metal layer of copper (Cu) and molybdenum-titanium alloy (MoTi) stacked on each other. The first metal pattern comprises a light blocking metal pattern LS1 and a VSS auxiliary electrode LS2. The light blocking metal pattern LS1 blocks light projected onto a semiconductor pattern of the driving element DT to prevent a leakage current and threshold voltage shift in the driving element DT, caused when the semiconductor pattern ACT1 is exposed to light. A low-level power supply voltage VSS is applied to the VSS auxiliary electrode LS2. The low-level power supply voltage VSS is supplied to the subpixels 101 through the VSS auxiliary electrode LS2. In FIG. 7, "LS3" refers to a metal pattern that can be formed on a pad region of the display panel 100, simultaneously with the first metal pattern. This metal pattern LS3 may be omitted. The pad region comprises a data pad region in which data pads connected to the data lines are arranged, and a data pad region in which data pads connected to the gate lines are arranged. FIG. 7 shows part of the gate pad region.

A buffer layer BUF of an insulating material such as silicon oxide (SiO$_2$) is formed on the first transparent substrate GLS1 so as to cover a first metal pattern LS1, LS2, and LS3. A driving element DT and a switching element S32 are formed on the buffer layer BUF. Semiconductor patterns ACT1 and ACT2 of the driving element DT and switching element S32 are formed on the buffer layer BUF. In the case of oxide semiconductor, the semiconductor patterns may be formed of indium gallium zinc oxide (IGZO).

A gate insulating pattern of an insulating material such as silicon oxide (SiO$_2$) is formed on the buffer layer BUF. The gate insulating pattern comprises a first gate insulating pattern GI1 formed on the first semiconductor pattern ACT1 and a second gate insulating pattern GI2 formed on the second semiconductor pattern ACT2. These gate insulating patterns GI1 and GI2 mask a channel region when source and drain regions of the semiconductor patterns ACT1 and ACT2 are doped with impurity ions. The gate insulating pattern further comprises an insulating pattern GI3 formed on the pad region.

A second metal pattern is formed on the gate insulating pattern GI1, GI2, and GI3. The second metal pattern is formed of copper (Cu), and comprise a gate line 104, a gate electrode GE1 of the driving element DT, a gate electrode GE2 of the switching element S32, and a lower electrode GE3 on the pad region. The lower electrode GE3 may be connected to the gate line 104.

An interlayer insulating film ILD is an insulating film that is formed of an insulating material such as silicon oxide (SiO$_2$) and covers the second metal pattern GE1, GE2, and GE3. The interlayer insulating film ILD has a plurality of contact holes. A first contact hole exposes the drain region of the first semiconductor pattern ACT1, and a second contact hole exposes the source region of the first semiconductor pattern ACT1. A third contact hole exposes the drain region of the switching element S32. A fourth contact hole exposes the lower electrode GE3 on the pad region.

A third metal pattern is formed on the interlayer insulating film ILD. The third metal pattern may be formed of a double metal layer of molybdenum-titanium alloy (MoTi) and copper (Cu). The third metal pattern comprises a first electrode SD1 of the driving element DT and a second electrode SD2 of the driving element DT. The second electrode SD2 of the driving element DT is integrated with a first electrode of the switching element S32. The third metal pattern further comprises an electrode SD3 connected to the VSS auxiliary electrode LS2 and an electrode SD4 that makes contact with the lower electrode GE3 on the pad region.

A passivation layer PAS is an insulating film that is formed of an insulating material such as silicon oxide (SiO$_2$) and covers the third metal pattern SD1, SD2, and SD3. A color filter CFB of the second light-emitting part 101B is formed on the passivation layer PAS. The color filter CFB comprises a red color filter through which red light passes, a green color filter through which green light passes, and a blue color filter through which blue light passes. Light from the second light-emitting diode OLED2 travels towards the back of the display panel 100 through the color filter CFB.

A planarization layer OC is formed of an insulating material such as acrylic photosensitive resin (PAC) to cover the color filter CFB. Contact holes are formed through the planarization layer PAC and the passivation layer PAS. The electrode SD3 connected to the VSS auxiliary electrode LS3 is exposed via a first contact hole formed through the planarization layer PAC and passivation layer PAS. The source region of the second semiconductor pattern ACT2 is exposed via a second contact hole formed through the planarization layer PAC and the passivation layer PAS. The electrode SD4 on the pad region is exposed via a third contact hole formed through the passivation layer PAS.

A first anode pattern is formed on the planarization layer OC by stacking indium tin oxide (ITO), molybdenum-titanium alloy (MoTi), and indium tin oxide (ITO) on one another. The first anode pattern comprises a first anode ANO1, a VSS upper electrode VSSE, and a pad electrode PAD. The first anode ANO1 is the anode of the first light-emitting diode OLED1 formed in the first light-emitting part 101T. The first anode ANO1 may make contact with the source region of the second semiconductor pattern ACT2 via the second contact hole formed through the planarization layer OC and passivation layer PAS. The VSS upper electrode VSSE makes contact with the VSS auxiliary electrode LS3 via the first contact hole formed through the planarization layer PAC and passivation layer PAS. The pad electrode PAD makes contact with the electrode SD4 on the pad region via the third contact hole formed through the passivation layer PAS.

A second anode pattern of a transparent electrode material such as indium tin oxide (ITO) is formed on the planarization layer OC. The second anode pattern comprises a second anode ANO2. The second anode ANO2 is the anode of the second light-emitting diode OLED2 formed in the second light-emitting part 101B, separated from the first anode ANO1.

A bank pattern BNK may be formed of polyimide (PI) to cover the anode patterns. The bank pattern BNK sections the first light-emitting part 101T and the second light-emitting part 101B off from each other. The bank pattern separates the first anode ANO1 and the organic compound layer EL at the boundary between the light-emitting parts 101T and 101B.

The organic compound layer EL is shared by the first light-emitting part 101T and the second light-emitting part 101B. The organic compound layer EL may comprise, but not limited to, a hole injection layer HIL, a hole transport layer HTL, an emission layer EML, an electron transport layer ETL, and an electron injection layer EIL.

The first cathode CAT1 is the cathode of the first light-emitting part 101T which is formed of a transparent electrode material such as indium zinc oxide (IZO). The second cathode CAT2 is the cathode of the second light-emitting diode OLED2 which is formed of a metal material such as aluminum (Al).

Light emitted from the first light-emitting diode OLED1 is reflected off the first anode ANO1 with high reflectivity, passes through the first cathode CAT1, which is transparent, and travels towards the front of the display panel 100. Light emitted from the second light-emitting diode OLED2 is reflected off the second cathode CAT2 with high reflectivity, passes through the second anode ANO2, which is transparent, and travels towards the back of the display panel 100.

A color filter CFT and a black matrix pattern BM are formed on the second transparent substrate GLS2, opposite the first light-emitting part 101T. Light from the first light-emitting diode OLED1 travels towards the front of the display panel 100 through the color filter CFT. The color filter CFT comprises a red color filter through which red light passes, a green color filter through which green light passes, and a blue color filter through which blue light passes.

The TFT and light-emitting diode array formed on the first transparent substrate GLS1 and the TFT and light-emitting diode array formed on the second transparent substrate GLS2 are bonded together with a face seal comprising a transparent adhesive. The face seal is a transparent adhesive with high reflectivity. After the bonding process, the electrode SD3 connected to the VSS auxiliary electrode LS2 may be completely connected to the VSS upper electrode VSSE by a laser welding process.

Figure 8:
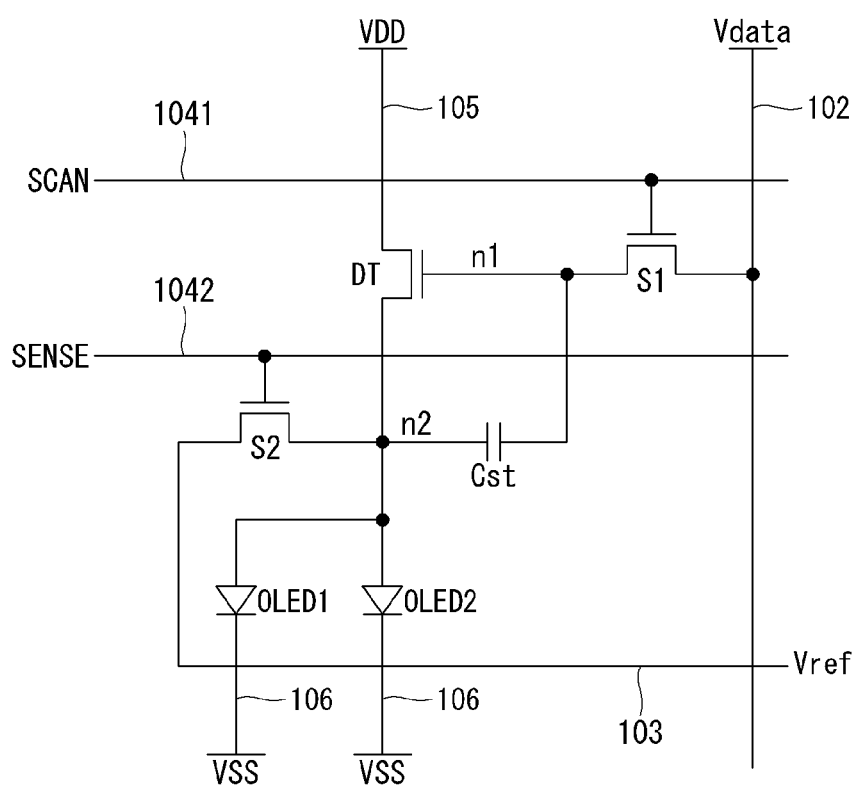
FIGS. 8 to 10 are circuit diagrams showing a pixel circuit according to an exemplary aspect of the present disclosure.
Figure 9:
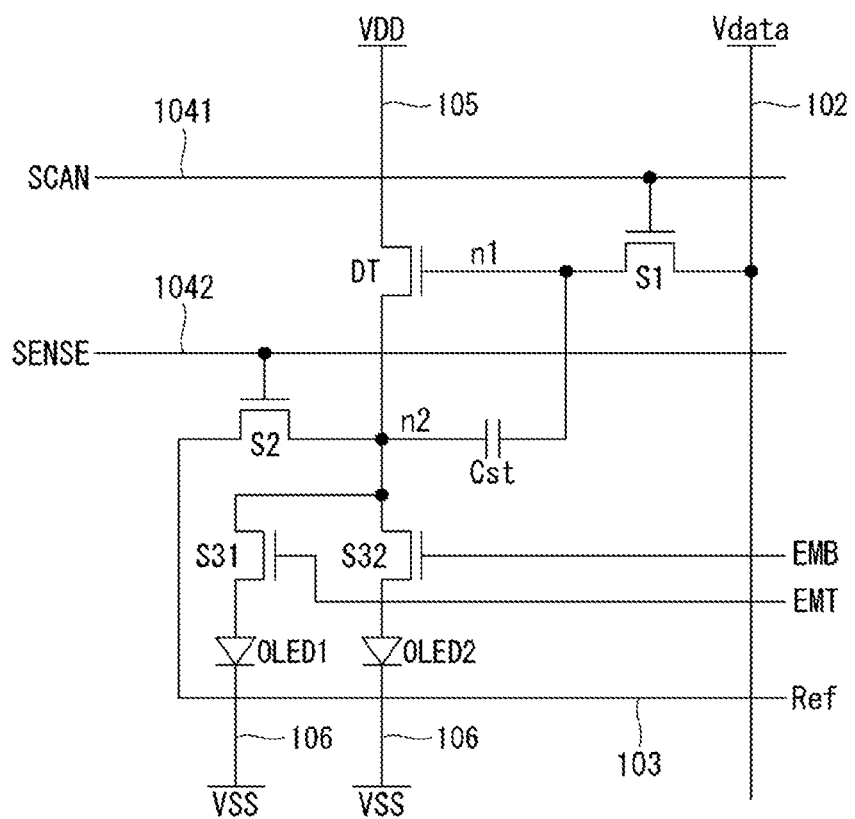
Figure 10:
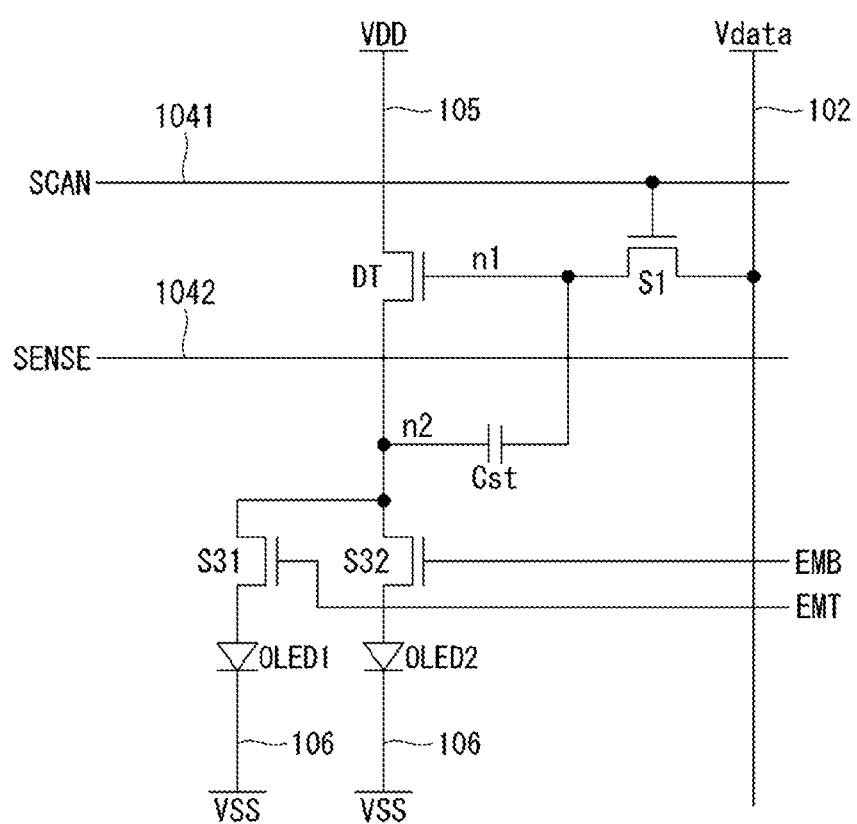

FIGS. 8 to 10 are circuit diagrams showing a pixel circuit according to an exemplary aspect of the present disclosure.

Referring to FIG. 8, the pixel circuit comprises first and second light-emitting diodes OLED1 and OLED2, a driving element DT for driving the first and second light-emitting diodes OLED1 and OLED2, a plurality of switching elements S1 and S2, and a capacitor Cst. The driving element DT and the switching elements are n-type transistors NMOS in FIG. 8, for example, but not limited to them.

The first light-emitting diode OLED1 is formed in the first light-emitting part 101T. The second light-emitting diode OLED2 is formed in the second light-emitting part 101B. The light-emitting diodes OLED1 and OLED2 emit light by a current generated by the gate-source voltage Vgs of the driving element DT which varies with data signal Vdata. As shown in FIG. 7, the light-emitting diodes OLED1 and OLED2 comprise an organic compound layer EL formed between the anodes ANO1 and ANO2 and the cathodes CAT1 and CAT2. The anode electrodes ANO1 and ANO2 of the light-emitting devices OLED1 and OLED2 are connected to the driving element DT and the capacitor Cst on the second node n2. The anode electrodes of the light-emitting elements OLED1 and OLED2 are connected to the second switching element S2 on the second node n2.

The first switching element S1 turns on in response to a scan signal SCAN to supply a data signal Vdata to the gate of the driving element DT connected to a first node n1. The first switching element S1 comprises a gate connected to a first gate line 1041 to which the scan signal SCAN is applied, a first electrode connected to a data line 102, and a second electrode connected to the first node n1.

The second switching element S2 turns on in response to a sensing signal SENSE to supply a reference voltage Vref to a second node n2. The second switching element S2 comprises a gate connected to a second gate line 1042 to which the sensing signal SENSE is applied, a first electrode connected to a sensing line 103 to which the reference voltage Vref is applied, and a second electrode connected to the second node n2. In an external compensation method, when the second switching element S2 is turned on, the voltage of the second node, i.e., the source voltage of the driving element DT, is sensed through the second switching element S2 and the sensing line 103, and pixel data of an input image is modulated based on the sensing result.

The driving element DT adjusts the current flowing through the first and second light-emitting diodes OLED1 and OLED2 in response to the gate-source voltage Vgs, and drives the light-emitting diodes OLED1 and OLED2. The driving element DT comprises a gate connected to the first node n1, a first electrode to which pixel driving voltage VDD is supplied, and a second electrode connected to the anodes of the light-emitting diodes OLED1 and OLED2 through the second node n2. The capacitor Cst is connected between the first node n1 and the second node n2 to store the gate-source voltage Vgs of the driving element DT.

In the pixel circuit shown in FIG. 8, the light-emitting diodes OLED1 and OLED2 of the first and second light-emitting parts 101T and 101B are simultaneously driven so that the same image is displayed simultaneously on the front and back of the display panel 100.

FIGS. 9 and 10 show an example in which switching elements for switching the light emission time are added to the pixel circuit. FIG. 10 shows a pixel circuit to which external compensation is not applied. In the pixel circuit shown in FIG. 10, the second switching element S2 and the sensing line 103 are omitted. In the pixel circuit shown in FIGS. 9 and 10, the same elements as those in the pixel circuit of FIG. 8 are denoted by the same reference numerals, and a detailed description of them will be omitted.

Referring to FIGS. 9 and 10, the pixel circuit further comprises third and fourth switching elements S31 and S32.

The third switching element S31 is placed between the driving element DT and the first light-emitting diode OLED1 and turns on in response to the gate-on voltage of a first emission control signal EMT to form a current path between the driving element DT and the first light-emitting diode OLED1. The third switching element S31 turns off when the voltage of the first emission control signal EMT is the gate-off voltage, to break the current path between the driving element DT and the first light-emitting diode OLED1.

The fourth switching element S32 is placed between the driving element DT and the second light-emitting diode OLED2 and turns on in response to the gate-on voltage of a second emission control signal EMB to form a current path between the driving element DT and the second light-emitting diode OLED2. The fourth switching element S32 turns off when the voltage of the second emission control signal EMB is the gate-off voltage, to break the current path between the driving element DT and the second light-emitting diode OLED2.

Figure 11:
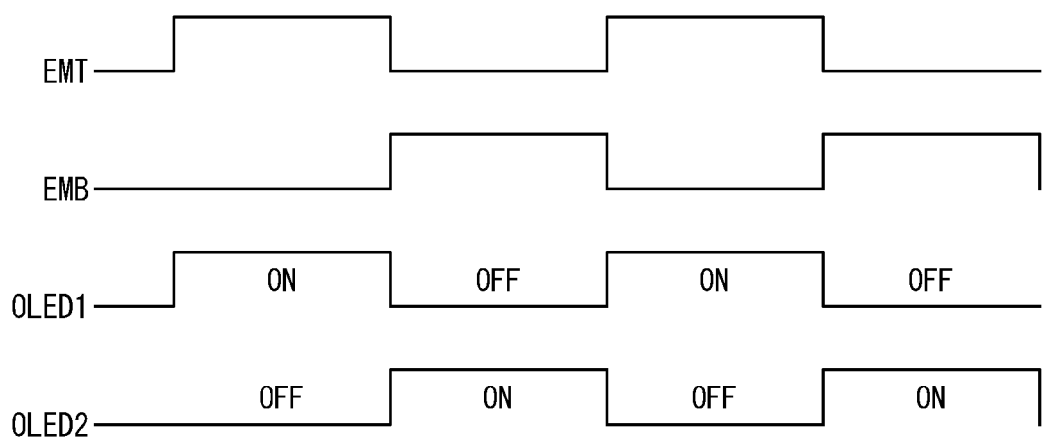
FIG. 11 is a waveform diagram showing the light emission signals and light-emitting diode on and off times of FIGS. 9 and 10.

In the double-sided display mode, when the third and fourth light-emitting parts S31 and S32 are alternately turned on at predetermined time intervals of, for example, 1 frame, the first and second light-emitting diodes OLED1 and OLED2 may be alternately turned on and emit light as shown in FIG. 11.

As described above, in the present disclosure, data drivers are connected to both ends of data lines on a double-sided display to supply a first pixel data signal of a first image to a first data line and a first pixel data signal of a second image to an nth data line. Consequently, the present disclosure allows for displaying an image on both the front and back of the double-sided display without left-right reversal.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A double-sided display comprising:
   a display panel where n data lines (where n is a positive integer equal to or greater than 2) and m gate lines (where m is a positive integer equal to or greater than 2) intersect each other and a plurality of subpixels are arranged;
   a first data driver connected to one end of the n data lines and applying a data signal of a first image to the n data lines;
   a second data driver connected to the other end of the n data lines and applying a data signal of a second image to the n data lines; and
   a gate driver connected to the m gate lines and sequentially applies a gate signal to the m gate lines,
   wherein each subpixel comprises:
   a first light-emitting part that emits light toward a front side of the display panel; and
   a second light-emitting part that emits light toward a back side of the display panel,
   wherein the first data driver supplies a first pixel data signal of the first image to a first data line and an nth pixel data signal of the first image to an nth data line, and the second data driver supplies a first pixel data signal of the second image to the nth data line and an nth pixel data signal of the second image to the first data line.

2. The double-sided display of claim 1, wherein the first light-emitting part and the second light-emitting part share the n data lines and the m gate lines.

3. The double-sided display of claim 2, wherein light emitted from the first light-emitting part is reflected off a first anode and passes through a first cathode, and light emitted from the second light-emitting part is reflected off a second cathode and passes through a second anode.

4. The double-sided display of claim 3, wherein the first and second light-emitting parts are driven simultaneously or alternately at predetermined time intervals.

5. The double-sided display of claim 4, wherein each subpixel further comprises:
   a first light-emitting diode that emits light from the first light-emitting part;
   a second light-emitting diode that emits light from the second light-emitting part;
   a driving element that drives the first and second light-emitting parts in response to a gate-source voltage; and
   a capacitor that stores the gate-source voltage of the driving element.

6. The double-sided display of claim 5, wherein each subpixel further comprises:
   a first switching element that turns on in response to a scan signal applied through a first gate line to connect a gate of the driving element to a data line; and
   a second switching element that turns on in response to a sensing signal applied through a second gate line to connect a sensing line to a source of the driving element.

7. The double-sided display of claim 6, wherein each subpixel further comprises:
   a third switching element that switches a current path between the driving element and the first light-emitting part in response to a first emission control signal; and
   a fourth switching element that switches a current path between the driving element and the second light-emitting part in response to a second emission control signal.

8. The double-sided display of claim 4, wherein each subpixel further comprises:
   a first light-emitting diode that emits light from the first light-emitting part;
   a second light-emitting diode that emits light from the second light-emitting part;
   a driving element that drives the first and second light-emitting parts in response to a gate-source voltage;
   a capacitor that stores the gate-source voltage of the driving element;
   a first switching element that turns on in response to a scan signal applied through a gate line to connect a gate of the driving element to a data line;
   a third switching element that switches a current path between the driving element and the first light-emitting part in response to a first emission control signal; and
   a fourth switching element that switches a current path between the driving element and the second light-emitting part in response to a second emission control signal.

9. A double-sided display comprising:
   a display panel where n data lines (where n is a positive integer equal to or greater than 2) and m gate lines (where m is a positive integer equal to or greater than 2) intersect each other and a plurality of subpixels are arranged;
   a first data driver connected to a first end of the n data lines and a second data driver connected to a second end of the n data lines, and one of the first and second data drivers applying a data signal of a first image and a data signal of a second image to the n data lines;
   a gate driver connected to the m gate lines and sequentially applying a gate signal to the gate lines,
   wherein each subpixel comprises:

a first light-emitting part that emits light toward a front side of the display panel; and a second light-emitting part that emits light toward a back side of the display panel, wherein the one of the first and second data drivers supplies a data signal representing at least part of the first image to the n data lines during a first display period and supplies a data signal representing at least part of the second image to the n data lines during a second display period.

10. A double-sided display comprising:

a display panel where n data lines and m gate lines intersect each other (where m and n are positive integers equal to or greater than 2);

a plurality of subpixels disposed at the display panel, and each subpixel including a first light-emitting part emitting light toward a front side of the display panel and a second light-emitting part emitting light toward a back side of the display panel, wherein the first and second light-emitting parts share a same organic compound layer;

a gate driver connected to the m gate lines and sequentially applying a gate signal to the m gate lines; and a first data driver connected to a first end of the n data lines and a second data driver connected to a second end of the n data lines and one of the first and second data drivers applying a data signal of a first image and a data signal of a second image to the n data lines, wherein the one of the first and second data drivers supplies a first data signal representing at least part of the first image to the n data lines during a first display period and supplies a second data signal representing at least part of the second image to the n data lines during a second display period.

11. The double-sided display of claim 10, wherein the first light-emitting part and the second light-emitting part share the n data lines and the m gate lines.

12. The double-sided display of claim 11, wherein light emitted from the first light-emitting part is reflected off a first anode and passes through a first cathode, and light emitted from the second light-emitting part is reflected off a second cathode and passes through a second anode.

13. The double-sided display of claim 12, wherein the first and second light-emitting parts are driven simultaneously or alternately at predetermined time intervals.

14. The double-sided display of claim 13, wherein each subpixel further comprises:

a first light-emitting diode emitting light from the first light-emitting part;

a second light-emitting diode emitting light from the second light-emitting part;

a driving element driving the first and second light-emitting parts in response to a gate-source voltage; and a capacitor storing the gate-source voltage of the driving element.

15. The double-sided display of claim 14, wherein each subpixel further comprises:

a first switching element turning on in response to a scan signal applied through a first gate line to connect a gate of the driving element to a data line; and a second switching element turning on in response to a sensing signal applied through a second gate line to connect a sensing line to a source of the driving element.

16. The double-sided display of claim 15, wherein each subpixel further comprises:

a third switching element switching a current path between the driving element and the first light-emitting part in response to a first emission control signal; and a fourth switching element switching a current path between the driving element and the second light-emitting part in response to a second emission control signal.

17. The double-sided display of claim 13, wherein each subpixel further comprises:

a first light-emitting diode emitting light from the first light-emitting part;

a second light-emitting diode emitting light from the second light-emitting part;

a driving element driving the first and second light-emitting parts in response to a gate-source voltage;

a capacitor storing the gate-source voltage of the driving element;

a first switching element turning on in response to a scan signal applied through a gate line to connect a gate of the driving element to a data line;

a third switching element switching a current path between the driving element and the first light-emitting part in response to a first emission control signal; and a fourth switching element switching a current path between the driving element and the second light-emitting part in response to a second emission control signal.

18. The double-sided display of claim 10, wherein each subpixel includes a metal pattern disposed on a transparent substrate.

19. The double-sided display of claim 18, wherein the metal pattern is formed of a double metal layer of copper (Cu) and molybdenum-titanium alloy (MoTi) stacked on each other.

20. The double-sided display of claim 18, wherein the metal pattern includes a light blocking metal pattern preventing a leakage current and threshold voltage shift in a driving element.

* * * * *